United States Patent
Chen et al.

(10) Patent No.: US 6,862,722 B2
(45) Date of Patent: Mar. 1, 2005

(54) EXTENDABLE METHOD FOR REVISING PATTERNED MICROELECTRONIC CONDUCTOR LAYER LAYOUTS

(75) Inventors: Hsiao-Hui Chen, Hsinchu (TW); Cheng-Hsiung Kuo, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/325,387

(22) Filed: Dec. 20, 2002

(65) Prior Publication Data

US 2004/0123263 A1 Jun. 24, 2004

(51) Int. Cl.[7] .............................................. G06F 17/50
(52) U.S. Cl. ........................................................ 716/12
(58) Field of Search ............................ 716/12–15, 11, 716/1–10

(56) References Cited

U.S. PATENT DOCUMENTS

| | | | |
|---|---|---|---|
| 5,446,675 A | | 8/1995 | Yoshimura |
| 5,850,348 A | * | 12/1998 | Berman ........................ 716/6 |
| 5,901,066 A | * | 5/1999 | Hong ............................. 716/8 |
| 5,943,485 A | * | 8/1999 | Bracha et al. ................. 716/1 |
| 5,946,218 A | * | 8/1999 | Taylor et al. ................. 716/12 |
| 6,134,702 A | | 10/2000 | Scepanovic et al. |
| 6,154,873 A | | 11/2000 | Takahashi |
| 6,170,080 B1 | * | 1/2001 | Ginetti et al. ................. 716/18 |
| 6,189,131 B1 | * | 2/2001 | Graef et al. .................... 716/8 |
| 6,243,849 B1 | * | 6/2001 | Singh et al. .................... 716/8 |
| 6,298,469 B1 | * | 10/2001 | Yin ................................. 716/3 |
| 6,374,256 B1 | * | 4/2002 | Ng et al. ................. 707/103 R |
| 6,519,749 B1 | * | 2/2003 | Chao et al. .................... 716/9 |
| 6,536,028 B1 | * | 3/2003 | Katsioulas et al. ........... 716/17 |
| 6,581,200 B2 | * | 6/2003 | Chopra et al. ................ 716/12 |
| 6,691,292 B2 | * | 2/2004 | Hatanaka ........................ 716/8 |
| 2003/0070152 A1 | * | 4/2003 | Muller ......................... 716/10 |

* cited by examiner

Primary Examiner—A. M. Thompson
Assistant Examiner—Magid Y. Dimyan
(74) Attorney, Agent, or Firm—Tung & Associates

(57) ABSTRACT

A method for revising a patterned conductor layer and a system for revising the patterned conductor layer employ an unoccupied equivalent wiring location. The unoccupied equivalent wiring location is provided in each of a series of wiring layout records. At least one optional wiring pattern may be formed in the unoccupied equivalent wiring location. The method and system provide for extending to all of the series of wiring layout records an optional wiring pattern and an interconnect option formed within a single one of the series of wiring layout records.

22 Claims, 4 Drawing Sheets

EXTENDABLE METHOD FOR REVISING PATTERNED MICROELECTRONIC CONDUCTOR LAYER LAYOUTS

BACKGROUND OF THE INVENTION

1. Field of the Invention

The present invention relates generally to methods for revising patterned conductor layer layouts employed for fabricating microelectronic fabrications. More particularly, the present invention relates to methods for efficiently revising patterned conductor layer layouts employed for fabricating microelectronic fabrications.

2. Description of the Related Art

Microelectronic fabrications are formed from microelectronic substrates over which are formed patterned microelectronic conductor layers which are separated by microelectronic dielectric layers.

Integral to the fabrication of patterned microelectronic conductor layers within microelectronic fabrications is the design and development of patterned microelectronic conductor layer layouts employed for fabricating patterned microelectronic conductor layers within microelectronic fabrications. Such patterned microelectronic conductor layer layouts are generally designed and developed employing computer assisted design software programs and computer assisted simulation software programs, such as to verify prior to production of a particular microelectronic fabrication having fabricated therein a particular patterned microelectronic conductor layer layout the operational properties of the microelectronic fabrication, such as not to wastefully expend manufacturing resources when fabricating the particular microelectronic fabrication.

In the process of designing and developing patterned microelectronic conductor layer layouts for use when fabricating microelectronic fabrications, it is common in the art of microelectronic fabrication to employ any of several iterative methods for purposes of optimizing a patterned microelectronic conductor layer layout such as to in turn provide an enhanced microelectronic fabrication performance. While such iterative methods do in fact provide an optimized patterned microelectronic conductor layer layout which in turn provides an enhanced microelectronic fabrication performance, such iterative methods are often time consuming, in particular when employed for optimizing a library of patterned microelectronic conductor layer layouts which is employed within a corresponding library of related microelectronic fabrications such as to in turn optimize performance of the corresponding library of related microelectronic fabrications.

It is thus desirable in the art of microelectronic fabrication to provide methods for efficiently designing patterned microelectronic conductor layer layouts for use when fabricating microelectronic fabrications.

It is towards the foregoing object that the present invention is directed.

Various methods, apparatus and systems have been disclosed in the microelectronic fabrication art to assist in efficiently designing microelectronic layer layouts and microelectronic structure layouts which are employed when fabricating microelectronic fabrications.

Included among the methods, apparatus and systems, but not limited among the methods, apparatus and systems are methods, apparatus and systems disclosed within: (1) Yoshimura, in U.S. Pat. No. 5,446,675 (a method, apparatus and system for using hierarchally organized data to design a semiconductor integrated circuit microelectronic fabrication layout, wherein a plurality of macros and circuit logic cells within the semiconductor integrated circuit microelectronic fabrication layout is cross-referenced employing two types of pointers); (2) Scepanovic et al., in U.S. Pat. No. 6,134,702 (a method and system for designing a semiconductor integrated circuit microelectronic fabrication layout which employs an iterative assignment of flexibly placeable cells in subsets of increasingly smaller number, in conjunction with a corresponding iterative determination of various circuit performance penalties for placing the subsets within particular configurations); and (3) Takahashi, in U.S. Pat. No. 6,154,873 (a method, apparatus and system for hierarchal design of semiconductor integrated circuit microelectronic fabrication layouts wherein hard macro blocks are first positioned and interconnected with patterned conductor layers which cross over soft macro blocks, and wherein a circuit performance penalty is evaluated with respect to the soft macro blocks such as to provide for optimal placement of cell components within columns or rows within the soft macro blocks).

Desirable in the microelectronic fabrication art are additional methods, apparatus and systems which may be employed for efficiently designing patterned microelectronic conductor layer layouts for use when fabricating microelectronic fabrications.

It is towards the foregoing object that the present invention is directed.

SUMMARY OF THE INVENTION

A first object of the present invention is to provide a method for designing a patterned microelectronic conductor layer layout for use when fabricating a microelectronic fabrication and a system for designing the patterned microelectronic conductor layer layout for use when fabricating the microelectronic fabrication.

A second object of the present invention is to provide the method for designing the patterned microelectronic conductor layer layout in accord with the first object of the present invention and a system for designing the patterned microelectronic conductor layer layout in accord with the first object of the present invention, wherein the patterned microelectronic conductor layer layout is efficiently designed.

A third object of the present invention is to provide a method for designing the patterned microelectronic conductor layer layout in accord with the first object of the present invention and the second object of the present invention and a system for designing the patterned microelectronic conductor layer layout in accord with the first object of the present invention and the second object of the present invention, wherein the method is readily commercially implemented.

In accord with the objects of the present invention, the present invention provides a method for revising a patterned microelectronic conductor layer layout within a microelectronic fabrication and a system for revising the patterned microelectronic conductor layer layout within the microelectronic fabrication.

To practice the method of the present invention, there is first provided a layout database having contained therein a first series of wiring layout records for a first series of microelectronic fabrications. The first series of wiring layout records comprises: (1) a series of required wiring patterns for each microelectronic fabrication within the first series of microelectronic fabrications; and (2) an unoccupied equivalent wiring location for each microelectronic fabrication within the first series of microelectronic fabrications within which unoccupied equivalent wiring location may be formed at least one optional wiring pattern. There is then designed within an unoccupied equivalent wiring location for a single microelectronic fabrication within the first series of microelectronic fabrications at least one optional wiring pattern and an interconnect option to the at least one optional wiring pattern. There is then saved within the layout database a second series of wiring layout records based upon the first series of wiring layout records, but wherein the unoccupied equivalent wiring location is substituted with the at least one optional wiring pattern and the interconnect option.

The method of the present invention contemplates a computer assisted system employed for practicing the method of the present invention.

There is provided by the present invention a method for designing a patterned microelectronic conductor layer layout for use when fabricating a microelectronic fabrication and a system for designing the patterned microelectronic conductor layer layout for use when fabricating the microelectronic fabrication, wherein the patterned microelectronic conductor layer layout is efficiently designed while employing the method for designing the patterned microelectronic conductor layer layout and the system for designing the patterned microelectronic conductor layer layout.

The present invention realizes the foregoing object by providing within each wiring layout record within a series of wiring layout records within a wiring layout database directed towards a series of microelectronic fabrications an unoccupied equivalent wiring location within which may be formed at least one optional wiring pattern. Thus, when there is designed within an unoccupied equivalent wiring location for a single wiring layout record within the series of wiring layout records (as directed towards a single microelectronic fabrication within the series of microelectronic fabrications) at least one optional wiring pattern and an interconnect option to the at least one optional wiring pattern, the same at least one optional wiring pattern and interconnect option to the at least one optional wiring pattern may be incorporated into the remaining unoccupied equivalent wiring locations within the remaining wiring layout records within the wiring layout database (to efficiently extend the wiring modification from the single microelectronic fabrication to the series of microelectronic fabrications).

The method of the present invention is readily commercially implemented.

The present invention employs microelectronic layer design tools, microelectronic layer layout tools and database manipulation tools as are otherwise generally conventional in the microelectronic fabrication art for designing microelectronic fabrications as are otherwise generally conventional in the microelectronic fabrication art, but employed within the context of a series of specific design and operational limitations which provide at least in part the present invention. Since it is at least in part a series of design and operational limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for designing a patterned microelectronic conductor layer layout for use when fabricating a microelectronic fabrication and a system for designing the patterned microelectronic conductor layer layout for use when fabricating the microelectronic fabrication, wherein the patterned microelectronic conductor layer layout is efficiently designed while employing the method for designing the patterned microelectronic conductor layer layout and the system for designing the patterned microelectronic conductor layer layout.

The present invention realizes the foregoing object by providing within each wiring layout record within a series of wiring layout records within a wiring layout database directed towards a series of microelectronic fabrications an unoccupied equivalent wiring location within which may be formed at least one optional wiring pattern. Thus, when there is designed within an unoccupied equivalent wiring location for a single wiring layout record within the series of wiring layout records (as directed towards a single microelectronic fabrication within the series of microelectronic fabrications) at least one optional wiring pattern and an interconnect option to the at least one optional wiring pattern, the same at least one optional wiring pattern and interconnect option to the at least one optional wiring pattern may be incorporated into the remaining unoccupied equivalent wiring locations within the remaining wiring layout records within the wiring layout database (to efficiently extend the wiring modification from the single microelectronic fabrication to the series of microelectronic fabrications).

Although the present invention and the preferred embodiment of the present invention provide particular value within the context of designing and revising patterned conductor layer layouts employed when fabricating semiconductor integrated circuit microelectronic fabrications, the present invention may be employed for designing and revising patterned conductor layer layouts employed when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
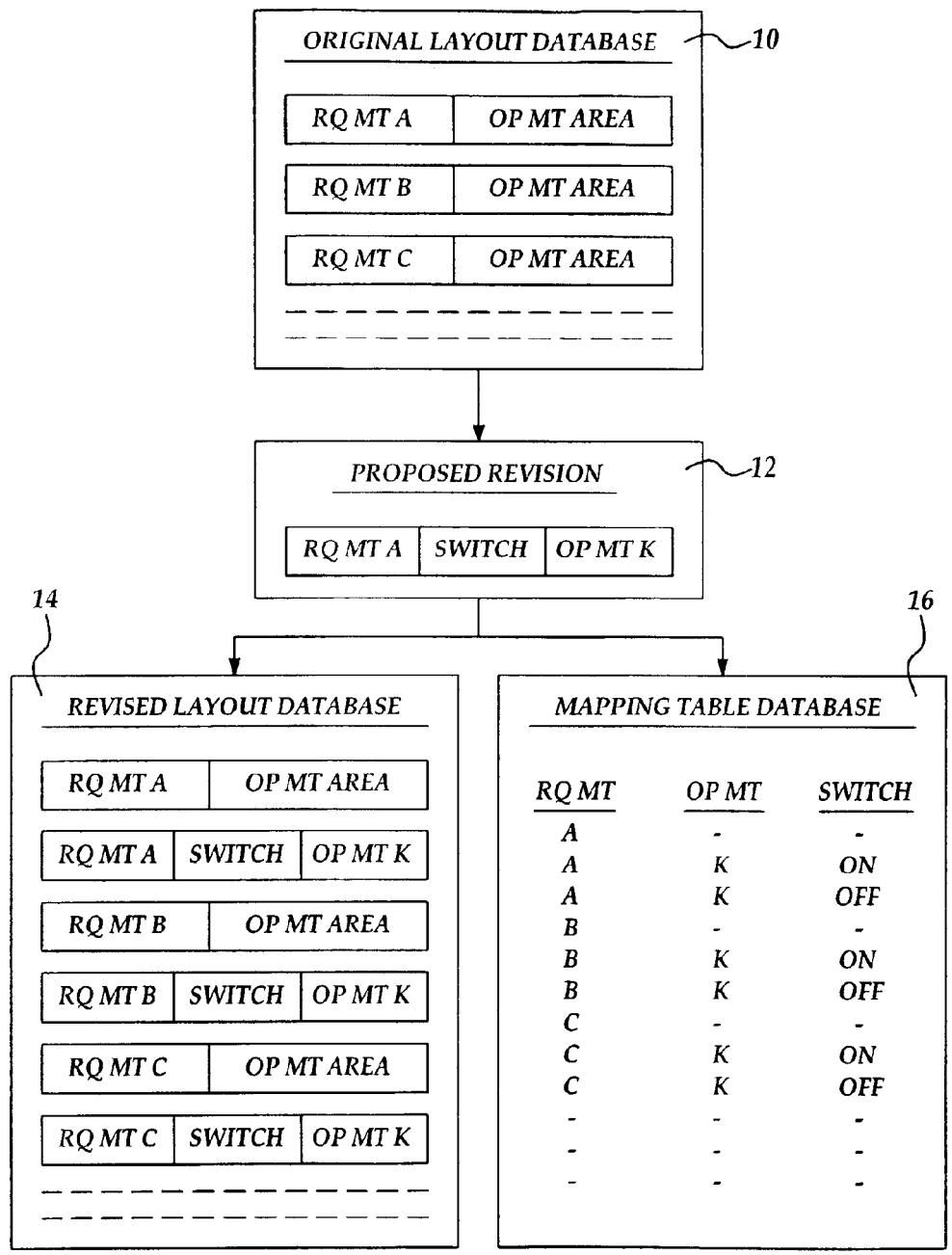
FIG. 1 shows a block diagram illustrating the results of a series of process steps in accord with a preferred embodiment of the present invention.

Referring not to FIG. 1, there is shown a block diagram illustrating the results of a series of process steps in accord with a preferred embodiment of the present invention.

Shown in FIG. 1, in a first instance, and in accord with the block which corresponds with reference numeral 10, is an original layout database having contained therein a series of wiring layout records for a series of microelectronic fabrications. As is further illustrated within the original layout database within the block which corresponds with reference numeral 10, and with respect to each of the wiring layout records within the series of wiring layout records, each wiring layout record within the series of wiring layout records comprises, in a first instance, a required metal pattern layout, illustrated, for example, as RQ MT A, RQ MT B or RQ MT C within the series of wiring layout records within the original layout database within the block which corresponds with reference numeral 10. Similarly, and also with respect to each of the wiring layout records within the series of wiring layout records, each wiring layout record within the series of wiring layout records also comprises, in a second instance, an unoccupied equivalent wiring location within which may be formed at least one optional wiring pattern. Within the preferred embodiment of the present invention, and as illustrated within the block which corresponds with reference numeral 10, a series of three unoccupied equivalent wiring locations is illustrated as OP MT AREA within each of the three wiring layout records as illustrated within the layout database within the block which corresponds with reference numeral 10.

Within the preferred embodiment of the present invention with respect to the unoccupied equivalent wiring locations OP MT AREA within each of the wiring layout records, typically and preferably the unoccupied equivalent wiring location is dedicated within a single metal layer within each of the wiring layout records as illustrated within the layout database within the block which corresponds with reference numeral 10, although such is not required within the context of the present invention. Similarly, typically and preferably, each of the wiring layout records illustrated within the original layout database within the block which corresponds with reference numeral 10 will be directed towards a multi-layer microelectronic fabrication.

Referring again to FIG. 1, and in accord with the block which corresponds with reference numeral 12, there is shown the results of the next process step in accord with the present invention.

In accord with the block which corresponds with reference numeral 12, there is then designed within an unoccupied equivalent wiring location within a single microelectronic fabrication within the series of microelectronic fabrications whose wiring layout records are illustrated within the original layout database within the block which corresponds with reference numeral 10 at least one optional wiring pattern (which is illustrated as OP MT K within the wiring layout record within the block which corresponds with reference numeral 12) in conjunction with an interconnect option (which is illustrated as SWITCH within the wiring layout record within the block which corresponds with reference numeral 12).

Within the preferred embodiment of the present invention with respect to the optional wiring pattern, the optional wiring pattern may perform any of several functions, such as but not limited to incorporating additional active or passive elements into a microelectronic fabrication within which it is formed, as well as simply providing alternative or supplemental wiring pathways within a microelectronic fabrication within which it is formed.

Within the preferred embodiment of the present invention with respect to the interconnect option, the interconnect option is intended as a simple component, such as but not limited to a length of a patterned conductor layer, whose presence or absence provides for a connection or an absence thereof between a required metal pattern and an optional metal pattern.

Referring again to FIG. 1, and in accord with the block which corresponds with reference numeral 14, there is shown the results of the next process step in accord with the preferred embodiment of the present invention.

In accord with the block which corresponds with reference numeral 14, the original layout database is revised in accord with the block which corresponds with reference numeral 10 to provide a revised layout database having contained therein: (1) a first series of wiring layout records corresponding with the series of wiring layout records within the original layout database in accord with the block which corresponds with reference numeral 10; (2) a second series of wiring layout records based upon the first series of wiring layout records, but wherein the unoccupied equivalent wiring location for each wiring layout record is substituted with the optional wiring pattern K and the interconnect option SWITCH from the proposed wiring layout revision in accord with the block which corresponds with reference numeral 12.

As is understood by a person skilled in the art, the methodology as is disclosed within FIG. 1 within the context of the blocks which correspond with reference numeral 10, reference numeral 12 and reference numeral 14 provides for a particularly efficient revision of a library of wiring layout records.

Referring again to FIG. 1, and in accord with the block which corresponds with reference numeral 16, incident to storing within the revised layout database in accord with the block which corresponds with reference numeral 14 the revised wiring layout records in addition to the original wiring layout records in accord with the block which corresponds with reference numeral 10, there is also either established or updated a mapping table database which corresponds with the wiring layout options within the revised layout database in accord with the block which corresponds with reference numeral 14. The mapping table database in accord with the block which corresponds with reference numeral 16 incorporates therein specific ON and OFF conditions for the interconnect option SWITCH between the required metal patterns RQ MT A, RQ MT B or RQ MT C, and the optional metal pattern OP MT K.

As is understood by a person skilled in the art, such a mapping table database is useful for selection of specific wiring layout options within a wiring layout database, for either microelectronic fabrication fabrication purposes or microelectronic fabrication modeling purposes.

Figure 2:
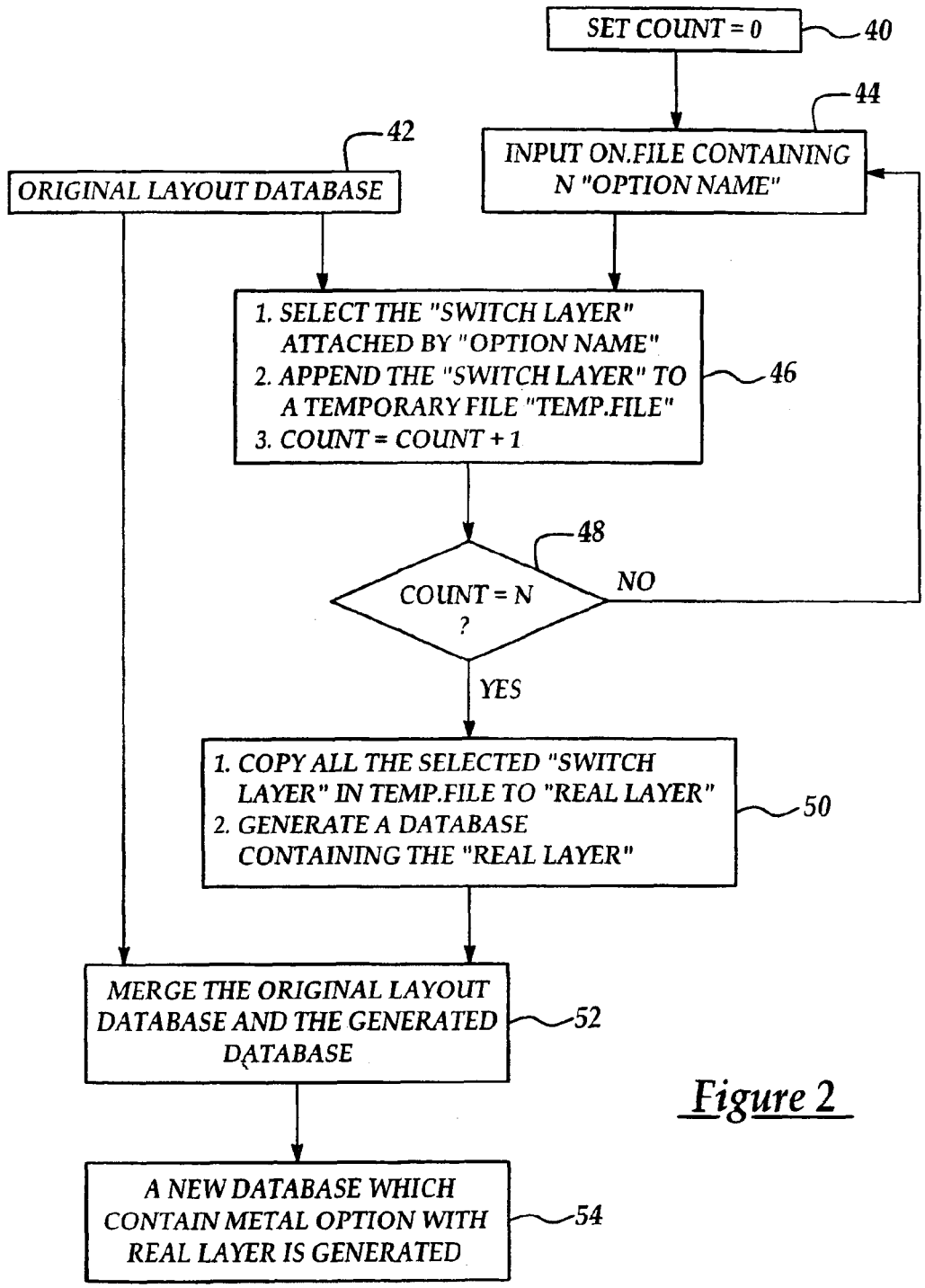
FIG. 2 and FIG. 3 show a pair of algorithmic flow diagrams illustrating in greater detail a pair of algorithms which may be employed in support of the process steps whose results are illustrated within the block diagram of FIG. 1.
Figure 3:
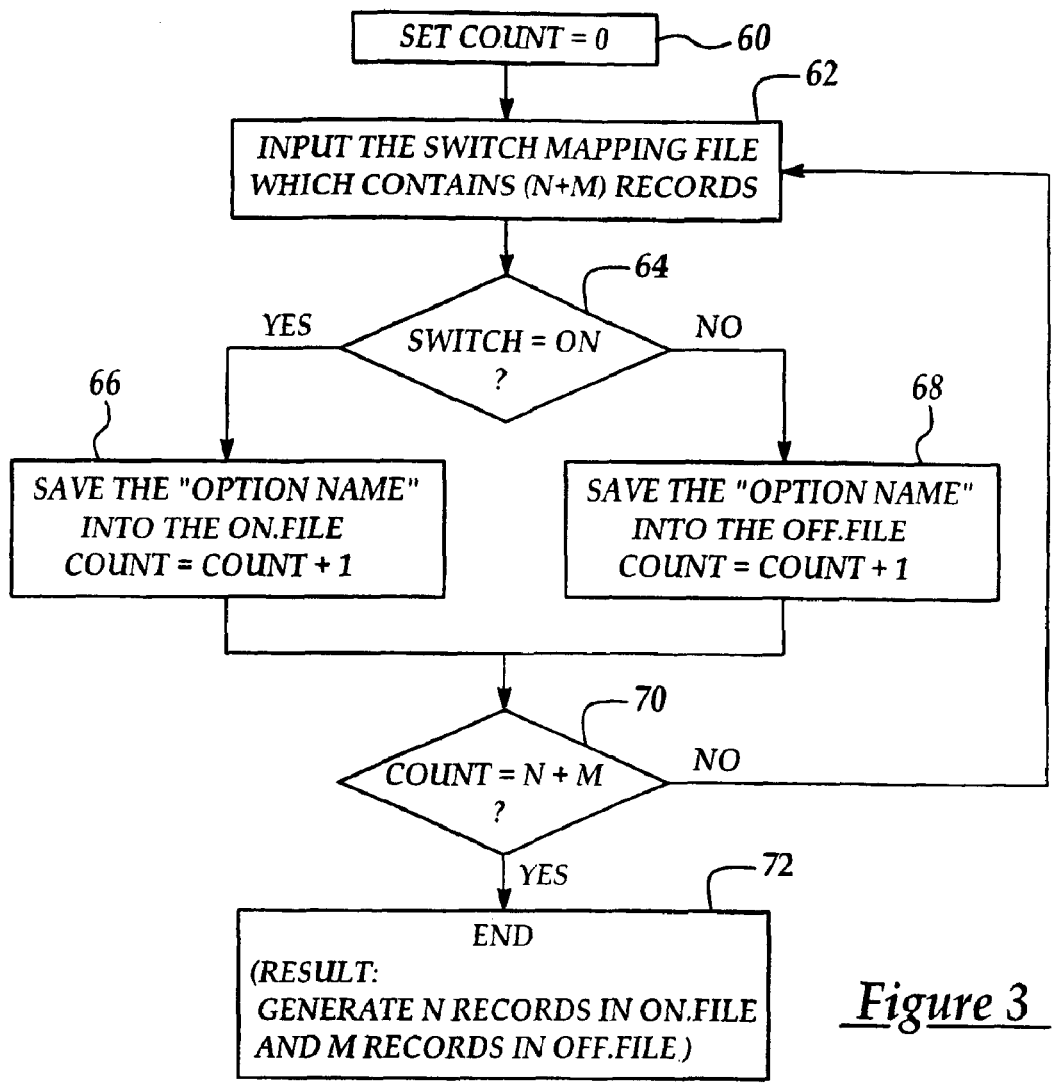

Referring now to FIG. 2 and FIG. 3, there is shown a pair of algorithmic flow diagrams illustrating in greater detail a pair of algorithms which may be employed in support of the process steps whose results are illustrated within the block diagram of FIG. 1.

Within the algorithmic flow diagram of FIG. 2, the algorithm is directed towards generation from the original layout database in accord with the block which corresponds with reference numeral 10 within the block diagram of FIG. 1 of the revised layout database as illustrated within the block which corresponds with reference numeral 14 within the block diagram of FIG. 1. Similarly, within the algorithmic flow diagram of FIG. 3, the algorithm is directed towards generation from the original layout database in accord with the block which corresponds with reference numeral 10 within the block diagram of FIG. 1 of the mapping table database in accord with the block which corresponds within the block diagram of FIG. 1.

Referring more particularly to the algorithmic flow diagram of FIG. 2, which is directed towards forming from the original layout database in accord with the block which corresponds with reference numeral 10 within the block diagram of FIG. 1 the revised layout database in accord with the block which corresponds with reference numeral 14 within the block diagram of FIG. 1, and in accord with the block which corresponds with reference numeral 40, a counter is first set to zero.

Next, and in accord with the blocks which correspond with reference numeral 42 and reference numeral 44, there is inputted the original layout database and an ON.file, which contains N "option names," for further manipulation. Within the block which corresponds with reference numeral 44, N equals the number of wiring layout records within the original layout database which are to be revised, and "option names" is intended to be the description of the optional metal pattern, OP MT K, as illustrated within the block which corresponds with reference numeral 12 within the block diagram of FIG. 1.

Next, and in accord with the blocks which correspond with reference numeral 46, reference numeral 48 and reference numeral 50, there is iteratively revised each of the wiring layout records within the original layout database to provide a series of revised wiring layout records which corresponds with the proposed revision as illustrated within the block which corresponds with reference numeral 12 within the block diagram of FIG. 1. Incident to such revision, successive switch layers are appended or attached to successive temporary files. Within the blocks which correspond with reference numeral 46 and reference numeral 50: (1) "switch layer" is intended to correspond with the interconnect option, SWITCH, within the block which corresponds with reference numeral 12 within the block diagram of FIG. 1; and (2) "real layer" is intended to correspond with optional metal pattern, OP MT K, within the block which corresponds with reference numeral 12 within the block diagram of FIG. 1.

Finally, within the blocks which correspond with reference numeral 52 and reference numeral 54 within the algorithmic flow diagram of FIG. 2, the original layout database, in accord with the block which corresponds with reference numeral 10 within the block diagram of FIG. 1, is merged with the generated database from the blocks which correspond with reference numeral 42, reference numeral 44, reference numeral 46, reference numeral 48 and reference numeral 50, to provide a new database which corresponds with the revised layout database in accord with the block which corresponds with reference numeral 14 within the block diagram of FIG. 1.

Referring more particularly to the algorithmic flow diagram of FIG. 3, which is directed towards forming from the original layout database in accord with the block which corresponds with reference numeral 10 within the block diagram of FIG. 1 the mapping table database in accord with the block which corresponds with reference numeral 16 as illustrated within the block diagram of FIG. 1, and in accord with the block which corresponds with reference numeral 60, a counter is again first set to zero.

Next, and in accord with the block which corresponds with reference numeral 62, there is inputted for further manipulation a switch mapping file which contains a total of N+M records, where each of N and M equals the number of wiring layout records within the original layout database in accord with the block which corresponds with reference numeral 10 within the block diagram of FIG. 1.

Next, and in accord with the blocks which correspond with reference numeral 64, reference numeral 66, reference numeral 68 and reference numeral 70, each of the N+M records is revised to provide: (1) a series of N records derived from series of N or M records within the original layout database, but where the interconnect option, SWITCH, for the optional metal pattern, OP MT K, in accord with the block which corresponds with reference numeral 12 within the block diagram of FIG. 1 is set on; and (2) a series of M records derived from the series of N or M records within the original layout database, but where the interconnect option, SWITCH, for the optional metal pattern, OP MT K, in accord with the block which corresponds reference numeral 12 within the block diagram of FIG. 1 is set off.

In accord with the block which corresponds with reference numeral 72, and in conjunction with the records within the original layout database, the additional N+M records provide the mapping table database in accord with the block which corresponds with reference numeral 16 within the block diagram of FIG. 1.

Figure 4:
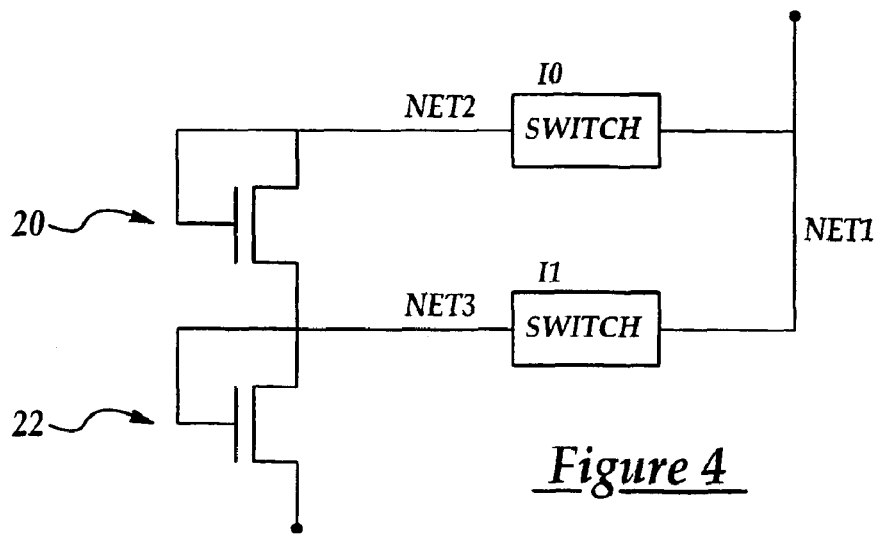
FIG. 4 shows a circuit diagram of a microelectronic circuit whose layout may be designed in accord with the present invention.

Referring now to FIG. 4, there is shown a circuit diagram of a microelectronic circuit whose layout may be designed and revised in accord with the present invention.

As is illustrated within the circuit diagram of FIG. 4, there is shown a first transistor 20 and a second transistor 22, where the first transistor 20 is connected to a wiring pattern designated as net2 which in turn may be connected to a wiring pattern designated as net1 through a switch designated as I0. Similarly, and as is also illustrated within the schematic circuit diagram of FIG. 4, the second transistor 22 is connected to a wiring pattern designated as net3 which in turn may be connected to the wiring pattern designated as net1 through a switch designated as I1.

Within the schematic circuit diagram of FIG. 4, net1 is intended to represent a required metal pattern, such as RQ MT A, RQ MT B or RQ MT C within the within the block diagram of FIG. 1. Similarly, within the schematic circuit diagram of FIG. 4, net2 and net3 are intended as optional wiring patterns, such as OP MT K within the block diagram of FIG. 1. Similarly, within the electrical circuit whose circuit diagram is illustrated in FIG. 4, both the switch I0 and the switch I1 are intended as corresponding with the optional interconnect SWITCH as illustrated within the block diagram of FIG. 1, and thus both the switch I0 and the switch Ii provide an option to wire either one or both of the first transistor 20 and the second transistor 22 into the electrical circuit whose block diagram is illustrated in FIG. 4.

Figure 5:
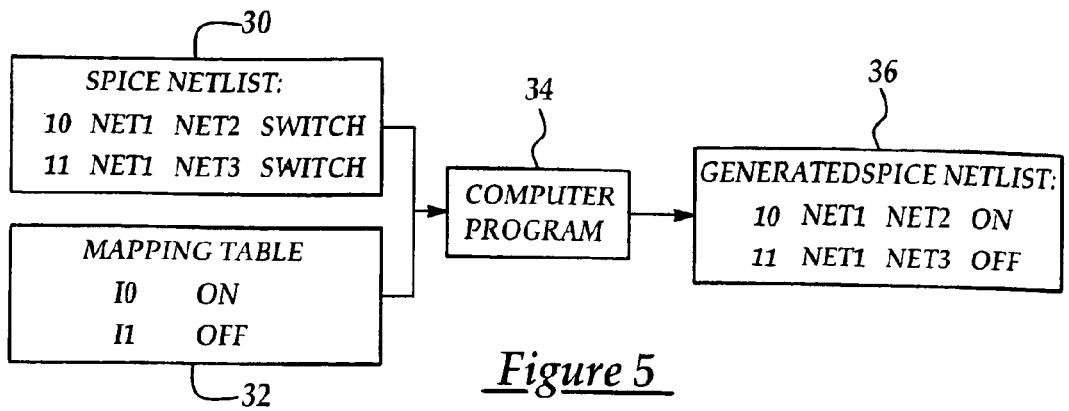
FIG. 5 shows a block diagram illustrating operation of the method of the present invention within the context of the microelectronic circuit whose circuit diagram is illustrated in FIG. 4.

Referring now to FIG. 5, there is shown a block diagram illustrating operation of the method of the present invention within the context of the microelectronic circuit whose circuit diagram is illustrated in FIG. 4.

As is illustrated within the block diagram of FIG. 5, and in accord with the block which corresponds with reference numeral 30, there is first obtained a netlist listing of wiring net components which comprise the electrical circuit whose circuit diagram is illustrated in FIG. 4. Similarly, and as is also illustrated within the block diagram of FIG. 5, and in accord with the block which corresponds with reference numeral 32, there is obtained from a mapping table for the electrical circuit whose circuit diagram is illustrated in FIG.

4 a pair of on/off conditions for the pair of switches I0 and I1 as illustrated within the circuit diagram of FIG. 4 needed to effect a desired final electrical circuit derived from the electrical circuit whose circuit diagram is illustrated in FIG. 4. For purposes of example, and without limitation, there is selected an ON value for switch I0 and an OFF value for switch I1.

Referring again to FIG. 5, and in accord with the blocks which correspond with reference numeral 34 and reference numeral 36, a computer program operates upon the netlist as provided within the block which corresponds with reference numeral 30, further in accord with the switch selection data which is provided by the mapping table in accord with the block which corresponds with reference numeral 32, to provide a newly generated netlist having the circuit switch options contained therein such as to contain information sufficiently complete to provide for either or both of circuit simulation or circuit fabrication for the electrical circuit whose circuit diagram is illustrated in FIG. 4.

Figure 6:
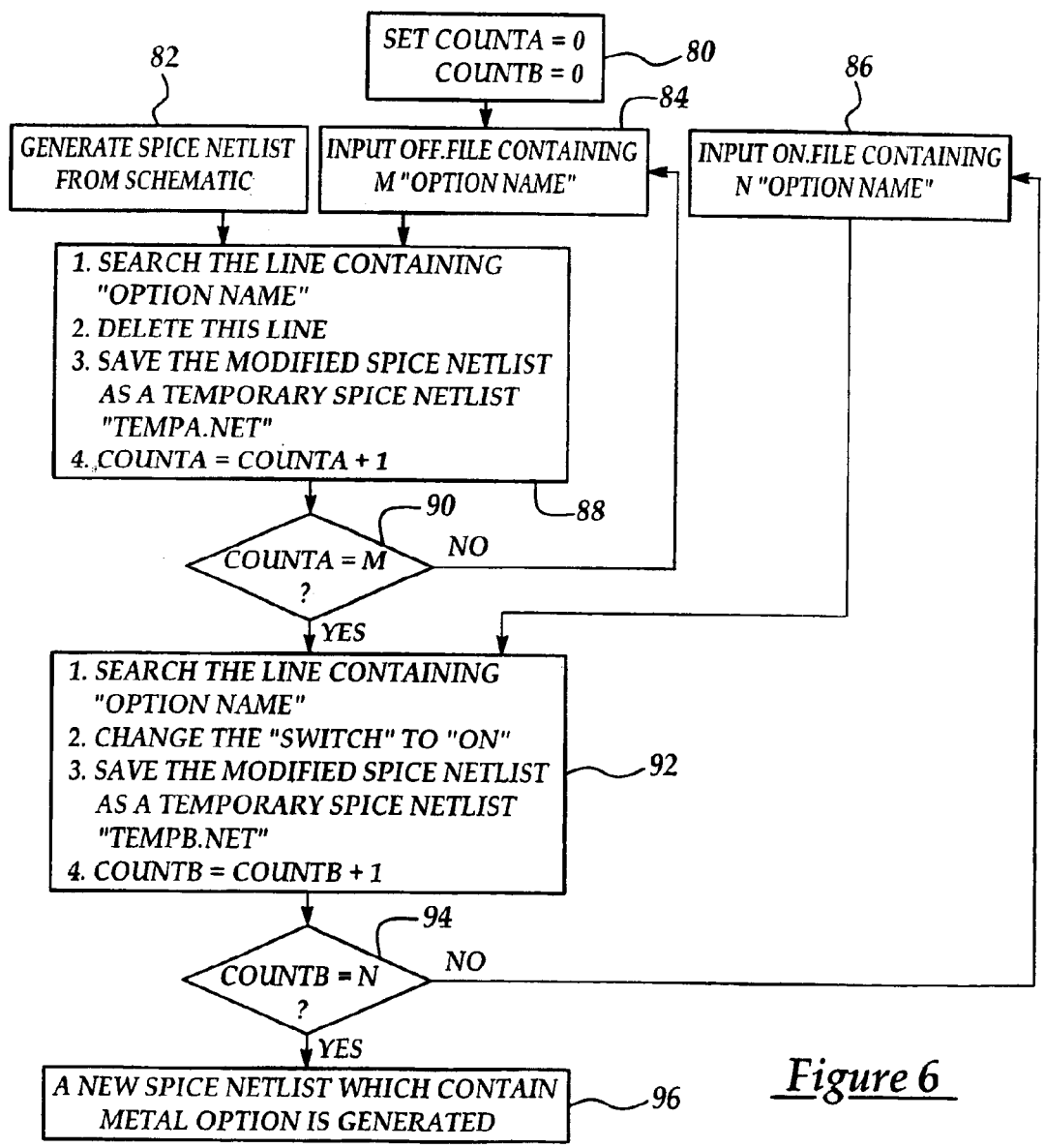
FIG. 6 shows an algorithmic flow diagram illustrating in greater detail an algorithm which may be employed in support of operation of the method of the present invention as illustrated within the block diagram of FIG. 5.

Referring now to FIG. 6, there is shown an algorithmic flow diagram illustrating in greater detail an algorithm which may be employed in support of operation of the method of the present invention as illustrated in the block diagram of FIG. 5.

As is illustrated within the algorithmic flow diagram of FIG. 6, and in accord with the block which corresponds with reference numeral 80, each of two counters is initialized to zero.

Next, and in accord with the block which corresponds with reference numeral 82, there is generated a spice netlist from a circuit diagram of an electrical circuit, similarly in accord with the spice netlist in accord with the block which corresponds with reference numeral 30 within the block diagram of FIG. 5, as derived from the electrical circuit whose circuit diagram is illustrated in FIG. 4.

Next, and in accord with the blocks which correspond with reference numeral 84, reference numeral 88 and reference numeral 90, a first portion the generated spice netlist is revised as appropriate to delete portions where an interconnect option is set in an off position and thus provide a first temporary spice netlist. Further, and in accord with the blocks which correspond with reference numeral 86, reference numeral 92 and reference numeral 94, a second portion of the generated spice netlist is revised as appropriate to incorporate portions where an interconnect option is set in an on position and thus provide a second temporary spice netlist.

Finally, and in accord with the block which corresponds with reference numeral 96 the first temporary spice netlist and the second temporary spice netlist are combined to provide from the originally generated spice netlist in accord with the block which corresponds with reference numeral 82 a newly generated spice netlist which conforms to an electrical circuit as it is desired to be modeled or fabricated.

As is understood by a person skilled in the art, and in particular in accord with the components and operations which correspond with FIG. 1 to FIG. 3 and FIG. 5 to FIG. 6, the present invention is typically, preferably and readily adapted to computer assisted systems for designing and revising patterned conductor layers when fabricating microelectronic fabrications.

Upon practice of the present invention in accord with the foregoing description, there is provided by the present invention a method for designing a patterned microelectronic conductor layer layout for use when fabricating a microelectronic fabrication and a system for designing the patterned microelectronic conductor layer layout for use when fabricating the microelectronic fabrication, wherein the patterned microelectronic conductor layer layout is efficiently designed while employing the method for designing the patterned microelectronic conductor layer layout and the system for designing the patterned microelectronic conductor layer layout.

The present invention realizes the foregoing object by providing within each wiring layout record within a series of wiring layout records within a wiring layout database directed towards a series of microelectronic fabrications an unoccupied equivalent wiring location within which may be formed at least one optional wiring pattern. Thus, when there is designed within an unoccupied equivalent wiring location for a single wiring layout record within the series of wiring layout records (as directed towards a single microelectronic fabrication within the series of microelectronic fabrications) at least one optional wiring pattern and an interconnect option to the at least one optional wiring pattern, the same at least one optional wiring pattern and interconnect option to the at least one optional wiring pattern may be incorporated into the remaining unoccupied equivalent wiring locations within the remaining wiring layout records within the wiring layout database (to efficiently extend the wiring modification from the single microelectronic fabrication to the series of microelectronic fabrications).

As is understood by a person skilled in the art, the preferred embodiment and example of the present invention are illustrative of the present invention rather than limiting of the present invention. Revisions and modifications may be made to components and structures employed within the preferred embodiment and example of the present invention, while still providing a method for revising a patterned conductor layer within a microelectronic fabrication and a system for revising the patterned conductor layer within the microelectronic fabrication, further in accord with the accompanying claims.

What is claimed is:

1. A method for revising a patterned conductor layer layout comprising:
   (a) generating from an original layout database a mapping table database containing a real layer and switch layer status and its corresponding position in a circuit layout;
   (b) inputting N option names into a processing device;
   (c) selecting a switch layer from the mapping table database and defining and attaching thereto an option name;
   (d) attaching the switch layer to a temporary file;
   (e) repeating steps (c) and (d) until all N option names are attached to a plurality of switch layers;
   (f) duplicating all of the plurality of switch layers in the temporary file to real layers and generating a database containing real layers;
   (g) combining the original layout database and the real layer database; and
   (h) generating a new metal option real layer database.

2. The method of claim 1 wherein generating the mapping table database comprises:
   inputting a switch mapping file containing N+M records where each of N and M equals the number of wiring layout records within the original layout database;
   determining whether a switch layer is in a first state or a second state and storing all option names corresponding with the first state as a first file of an on file and an off file and all option names corresponding with the second state as a second file of the on file and the off file; and terminating the switch layer determination and option name filing when N+M records is reached.

3. The method of claim 2 wherein the first state is a connected state.

4. The method of claim 3 wherein the first file is an on file.

5. The method of claim 2 wherein the second state is a disconnected state.

6. The method of claim 5 wherein the second file is an off file.

7. A method for revising a patterned conductor layer comprising:

providing a layout database having contained therein a first series of wiring layout records for a first series of microelectronic fabrications, the first series of wiring layout records comprising:
  a series of required wiring patterns for each microelectronic fabrication within the first series of microelectronic fabrications; and
  an unoccupied equivalent wiring location for each microelectronic fabrication within the first series of microelectronic fabrications within which unoccupied equivalent wiring locations are formed for at least one optional wiring pattern;

designing within an unoccupied equivalent wiring location for a single microelectronic fabrication within the first series of microelectronic fabrications at least one optional wiring pattern and an interconnect option to the at least one optional wiring pattern; and saving within the layout database a second series of wiring layout records based upon the first series of wiring layout records, but wherein the unoccupied equivalent wiring location for each wiring layout record is substituted with the at least one optional wiring pattern and the interconnect option.

8. The method of claim 7 further comprising:

providing in conjunction with the layout database a mapping table database which provides an on option and an off option for a series of interconnect options within the second series of wiring layout records.

9. The method of claim 8 further comprising employing the layout database and the mapping table database to design a microelectronic fabrication while employing a second wiring layout record from the second series of wiring layout records.

10. The method of claim 8 further comprising employing the layout database and the mapping table database to simulate a microelectronic fabrication while employing a second wiring layout record from the second series of wiring layout records.

11. The method of claim 8 wherein the layout database and the mapping table database are contained within a computer.

12. The method of claim 7 wherein the first series of wiring layout records and the second series of wiring layout records comprise wiring layout records directed towards fabricating microelectronic fabrications selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

13. The method of claim 7 wherein the unoccupied equivalent wiring location is contained within a single metal layer for each of the first series of wiring layout records.

14. The method of claim 7 wherein the interconnect option comprises a portion of the patterned conductor layer.

15. A system for revising a patterned conductor layer comprising:

means for storing a layout database having contained therein a first series of wiring layout records for a first series of microelectronic fabrications, the first series of wiring layout records comprising:
  a series of required wiring patterns for each microelectronic fabrication within the first series of microelectronic fabrications; and
  an unoccupied equivalent wiring location for each microelectronic fabrication within the first series of microelectronic fabrications within which unoccupied equivalent wiring locations are formed for at least one optional wiring pattern;

means for designing within an unoccupied equivalent wiring location for a single microelectronic fabrication within the first series of microelectronic fabrications at least one optional wiring pattern and an interconnect option to the at least one optional wiring pattern; and means for saving within the layout database a second series of wiring layout records based upon the first series of wiring layout records, but wherein the unoccupied equivalent wiring location for each wiring layout record is substituted with the at least one optional wiring pattern and the interconnect option.

16. The system of claim 15 further comprising:

means for storing in conjunction with the layout database a mapping table database which provides an on option and an off option for the series of interconnect options within the second series of wiring layout records.

17. The system of claim 16 further comprising means for employing the layout database and the mapping table database to design a microelectronic fabrication while employing a second wiring layout record from the second series of wiring layout records.

18. The system of claim 16 further comprising means for employing the layout database and the mapping table database to simulate a microelectronic fabrication while employing a second wiring layout record from the second series of wiring layout records.

19. The system of claim 15 wherein the first series of wiring layout records and the second series of wiring layout records comprise wiring layout records directed towards fabricating microelectronic fabrications selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

20. The system of claim 15 wherein the unoccupied equivalent wiring location is contained within a single metal layer for each of the first series of microelectronic fabrications.

21. The system of claim 15 wherein the interconnect option comprises a portion of the patterned conductor layer.

22. The system of claim 15 wherein the system is a computer assisted system.

* * * * *